United States Patent
Von Der Ropp

Patent Number: 5,818,779
Date of Patent: *Oct. 6, 1998

[54] BOARD HAVING A PLURALITY OF INTEGRATED CIRCUITS

[75] Inventor: Thomas Von Der Ropp, Germering, Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 610,046

[22] Filed: Mar. 4, 1996

[30] Foreign Application Priority Data

Mar. 3, 1995 [DE] Germany .................. 195 07 571.4

[51] Int. Cl.⁶ .................................................. G11C 13/00
[52] U.S. Cl. ........................... 365/226; 365/51; 365/105; 365/175
[58] Field of Search ................................... 365/226, 105, 365/175, 51, 72

[56] References Cited

U.S. PATENT DOCUMENTS

| | | | |
|---|---|---|---|
| 5,440,519 | 8/1995 | Mart et al. | 365/226 |
| 5,469,399 | 11/1995 | Sato et al. | 365/227 X |
| 5,563,838 | 10/1996 | Mart et al. | 365/226 |
| 5,596,758 | 1/1997 | Yatsuzuka | 365/226 X |
| 5,608,684 | 3/1997 | Reasoner et al. | 365/226 X |
| 5,623,224 | 4/1997 | Yamada et al. | 365/226 X |

OTHER PUBLICATIONS

Publ. Projekt 1988, vol. 3, pp. 120–124, (Bremeier) "8–Bit–Analog/Digital–Wandler".

*Primary Examiner*—Do Hyun Yoo
*Attorney, Agent, or Firm*—Herbert L. Lerner; Laurence A. Greenberg

[57] ABSTRACT

A board includes a plurality of integrated circuits operating at a first supply potential to be supplied. The board has a potential adaptation configuration with an output potential being the first supply potential and an input potential being a second supply potential to be supplied to the board.

6 Claims, 2 Drawing Sheets

BOARD HAVING A PLURALITY OF INTEGRATED CIRCUITS

BACKGROUND OF THE INVENTION

FIELD OF THE INVENTION

The invention relates to a board having a plurality of integrated circuits which operate at a suppliable first supply potential.

Integrated circuits (ICs) which are operated with a lower supply voltage than conventional ICs are being used more and more, because they consume less power. For example, recent generations of CMOS components are supplied with 3.3 V, instead of 5 V.

Heretofore, boards equipped with ICs had to be supplied with the supply voltage that was required by the ICs mounted on the board. If a user wishes to use a board in a 5 V environment, for instance, the ICs located on the board must also be capable of being supplied with 5 V. The situation is correspondingly the same for other supply voltages.

On one hand, depending on the environment in which a board is to be used, there is a need both for boards that can be supplied with a lower supply voltage and those that can be supplied with a higher supply voltage. On the other hand, it is in the interest of a manufacturer of boards equipped with ICs, and in the interest of vendors and manufacturers of the corresponding ICs, if they can, as much as possible, use or offer only ICs of the same type which can be supplied with the same supply voltage. The expense for storage and inventory could then be reduced for such parties. In the case of the IC manufacturer, in particular, the advantage would be obtained of not having to develop different variants of one and the same basic type of IC, which variants would differ from one another essentially only in their supply voltage. Such problems are encountered particularly by manufacturers of so-called modular boards, which are equipped with identical types of memory components, such as DRAMs, as well as by their vendors and IC manufacturers.

SUMMARY OF THE INVENTION

It is accordingly an object of the invention to provide a board with a plurality of integrated circuits, which overcomes the hereinafore-mentioned disadvantages of the heretofore-known devices of this general type and in which the integrated circuits operate at a first supply voltage and can be supplied with a second supply voltage that can differ from the first supply voltage.

With the foregoing and other objects in view there is provided, in accordance with the invention, a circuit board assembly, comprising a board; a plurality of integrated circuits on the board operating at a first supply potential to be supplied; and a potential adaptation configuration on the board having an output potential being the first supply potential and having an input potential being a second supply potential to be be supplied to the board.

With the board according to the invention, it becomes possible to use ICs that require a different supply voltage from that available for supplying the board.

In accordance with another feature of the invention, the integrated circuits are memory components.

In accordance with a further feature of the invention, the second supply potential is greater than the first supply potential.

In accordance with an added feature of the invention, the potential adaptation configuration may, for instance, be either a voltage controller or a diode.

In accordance with an additional feature of the invention, the potential adaptation configuration has an activatable bypassing device and other parts, the activatable bypassing device bypassing the other parts of the potential adaptation configuration in an active state, for setting the first supply potential equal to the second supply potential being applied.

If the potential adaptation configuration can be bypassed, then after the board is manufactured it is also possible to still determine whether it is supplied with a second supply voltage that differs from the first supply voltage, or a second supply voltage that matches the first supply voltage.

In accordance with a concomitant feature of the invention, the potential adaptation configuration is deactivatable. A deactivation of the potential adaptation configuration can then be performed in combination with the bypassing as well, so that it no longer affects the first supply potential. Simultaneous bypassing and deactivation is recommended, for instance if the potential adaptation configuration is a voltage controller.

Circuits that enable deactivation and bypassing are known to one skilled in the art. As an example, they can have fuses, antifuses, and/or transistors, which function as corresponding switches. In the latter case, the deactivation and bypassing would be reversible, so that the board can be adapted continually to different supply voltages.

Other features which are considered as characteristic for the invention are set forth in the appended claims.

Although the invention is illustrated and described herein as embodied in a board having a plurality of integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

DESCRIPTION OF THE PREFERRED EMBODIMENTS

Figure 1:
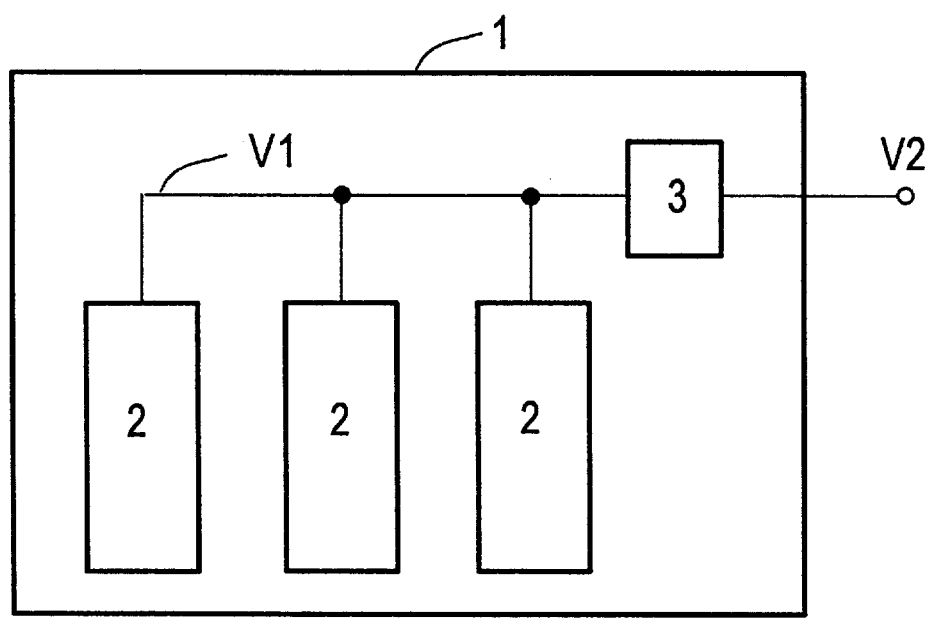
FIG. 1 is a block circuit diagram of an exemplary embodiment of the invention.

Referring now to FIG. 1 of the drawing in detail, there is seen a board 1 on which a plurality of integrated circuits 2 that operate at a first supply potential V1 are mounted. The first supply potential V1 is delivered to the integrated circuits as an output potential of a potential adaptation configuration 3. An input potential of the potential adaptation configuration 3 is a second supply potential V2 that can be supplied to the board.

The potential adaptation configuration 3 can be constructed especially simply as a voltage controller. This element can effect either an increase or a decrease in the second supply potential V2, depending on whether the first supply potential V1 is greater or less than the second supply potential V2. This embodiment of the invention is distinguished by the fact that fluctuations in the second supply potential V2 can be suppressed by the voltage controller 3 and thus do not affect the first supply potential V1, as long as the voltage controller 3 furnishes a stabilized output potential.

Figure 2:
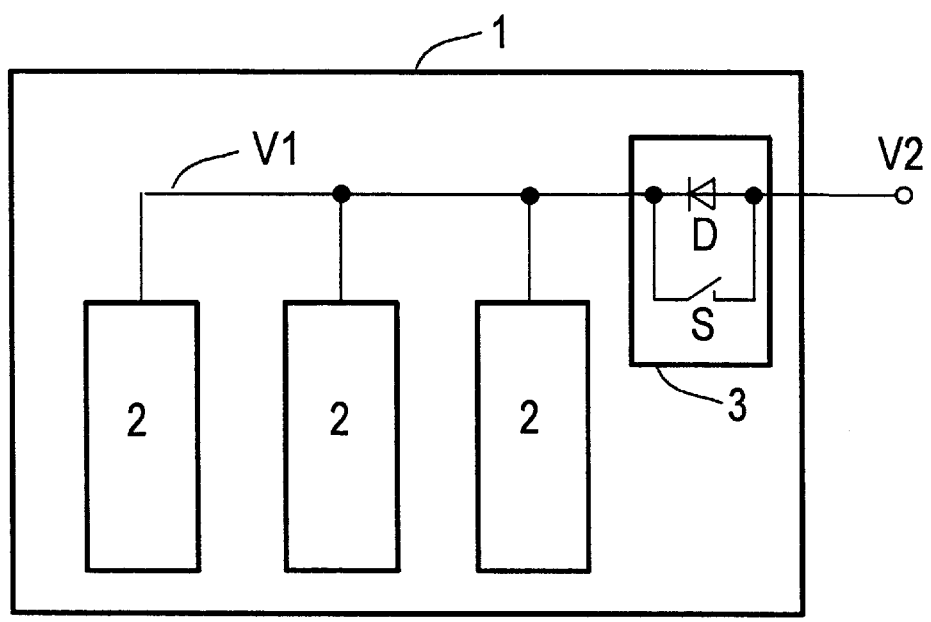
FIG. 2 is a view similar to FIG. 1 showing more details of a potential adaptation circuit.

As FIG. 2 shows, if the first supply potential V1 is less than the second supply potential V2, then the potential adaptation configuration 3 can have at least one diode D operated in the on-state direction. A voltage that is equivalent to the difference between the two supply potentials V1, V2 then drops at the diode. An activable bypassing device in the form of a switch S bypasses the diode D.

The first supply potential, with which the integrated circuits 2 are supplied, must meet certain specifications, if their proper function is to be assured. Since relative fluctuations in the second supply potential V2 can cause major relative fluctuations in the first supply potential V1, such as if the potential adaptation configuration 3 is a diode, an adaptation of the specifications for the second supply potential V2 of the board must be carried out if needed.

I claim:

1. A circuit board assembly, comprising:

a board;

a plurality of integrated circuits having supply terminals disposed on said board operating at a first supply potential to be supplied at said supply terminals of said integrated circuits;

a potential adaptation configuration on said board having an output potential connected to said supply terminals and having an input potential being a second supply potential to be supplied to said board; and said potential adaptation configuration having an activatable bypassing device and other parts, said activatable bypassing device bypassing said other parts of said potential adaptation configuration in an active state, for setting the first supply potential equal to the second supply potential being applied.

2. The circuit board assembly according to claim 1, wherein said integrated circuits are memory components.

3. The circuit board assembly according to claim 1, wherein the second supply potential is greater than the first supply potential if said bypassing device is in a deactivated state.

4. The circuit board assembly according to claim 1, wherein said potential adaptation configuration has at least one diode operated in an on-state direction.

5. The circuit board assembly according to claim 1, wherein said potential adaptation configuration is a voltage controller.

6. The circuit board assembly according to claim 1, wherein said potential adaptation configuration is deactivatable.

* * * * *